US012554193B2

(12) United States Patent
Hart et al.

(10) Patent No.: US 12,554,193 B2
(45) Date of Patent: Feb. 17, 2026

(54) PELLICLE COMPRISING SILICON CARBIDE NANOSTRUCTURE AND RELATED DEVICES AND METHODS (71) Applicant: ENTEGRIS, INC., Billerica, MA (US)

(72) Inventors: Amelia Heather-Sarah Church Hart, Fort Worth, TX (US); James O'Neill, Winchester, MA (US)

(73) Assignee: ENTEGRIS, INC., Billerica, MA (US)

( * ) Notice: Subject to any disclaimer, the term of this patent is extended or adjusted under 35 U.S.C. 154(b) by 559 days.

(21) Appl. No.: 18/071,296

(22) Filed: Nov. 29, 2022

(65) Prior Publication Data
US 2023/0176471 A1  Jun. 8, 2023

Related U.S. Application Data (60) Provisional application No. 63/285,343, filed on Dec. 2, 2021.

(51) Int. Cl.
G03F 1/64       (2012.01)
C01B 32/956     (2017.01)
G03F 1/22       (2012.01)
G03F 7/00       (2006.01)
B82Y 30/00      (2011.01)
B82Y 40/00      (2011.01)

(52) U.S. Cl.
CPC .............. G03F 1/64 (2013.01); C01B 32/956 (2017.08); G03F 1/22 (2013.01); G03F 7/70033 (2013.01); G03F 7/70983 (2013.01); B82Y 30/00 (2013.01); B82Y 40/00 (2013.01); C01P 2004/13 (2013.01)

(58) Field of Classification Search
CPC ..... G03F 1/64; G03F 1/22; G03F 1/24; G03F 1/62; C01B 32/956; B82Y 30/00; C01P 2004/13
See application file for complete search history.

(56) References Cited

U.S. PATENT DOCUMENTS

| 9,588,416 | B2 | 3/2017 | Englund et al. |
| 2017/0038676 | A1 | 2/2017 | Jung et al. |
| 2018/0149966 | A1 | 5/2018 | Shin et al. |
| 2018/0329289 | A1 | 11/2018 | Gallagher et al. |
| 2019/0390090 | A1 | 12/2019 | Kim et al. |
| 2021/0132490 | A1 | 5/2021 | Lin |
| 2021/0191255 | A1 | 6/2021 | Timmermans et al. |
| 2022/0244634 | A1* | 8/2022 | Hsu ........................... G03F 1/82 |

FOREIGN PATENT DOCUMENTS

| TW | 201918372 A | 5/2019 |
| WO | 2005085130 A2 | 9/2005 |
| WO | 2021172104 A1 | 9/2021 |

* cited by examiner

Primary Examiner — Stewart A Fraser (57) ABSTRACT

Disclosed are pellicles for use in extreme ultraviolet (EUV) lithography, the pellicles comprising silicon carbide nanostructures, and exhibiting high transmittance of EUV exposure light and high mechanical strength, as well as methods of using these pellicles.

14 Claims, 3 Drawing Sheets

PELLICLE COMPRISING SILICON CARBIDE NANOSTRUCTURE AND RELATED DEVICES AND METHODS

FIELD

The present description relates to pellicles for use in extreme ultraviolet (EUV) lithography, as well as methods of using these pellicles in extreme ultraviolet lithography processes. The pellicles include silicon carbide nanostructures and exhibit high transmittance of EUV light.

BACKGROUND

In the semiconductor manufacturing industry, lithography processes use lithographic templates (e.g., photomasks or reticles) to optically transfer patterns onto a substrate. Such a process may be accomplished by projecting radiation through a photomask, or by reflecting radiation at a surface of a photomask, and onto a substrate that includes a coating of material (e.g., "photoresist") that is sensitive to the radiation. The minimum feature size that may be formed using this type of lithography process is limited by the wavelength of the radiation.

To produce smaller feature sizes, a process can use radiation of shorter wavelengths to illuminate the radiation-sensitive photoresist material. A standard type of exposure equipment uses 193 nanometer light from an ArF light source. However, the semiconductor processing industry now looks to lithography processes that use "extreme ultraviolet (EUV)" radiation. In comparison to other standards, extreme ultraviolet (EUV) lithography technology uses much shorter wavelength light, e.g., 13.5 nm wavelength light.

However, EUV systems are very sensitive to contamination issues. Extreme ultraviolet systems use reflective optics (e.g., mirrors), rather than conventional refractive optics (transmissive lenses). Particle contaminants that may be present in an EUV lithography system may contact a reflective EUV mask and cause significant degradation of a lithographically-transferred pattern that is produced from the mask. To prevent particles from settling on a reflective mask and interfering with the reflective optics, EUV lithography systems include a pellicle membrane disposed over the EUV mask. The pellicle membrane is supported over the mask at a location spaced slightly from the mask reflective surface to prevent contaminant particles from settling onto the reflective mask surface.

A pellicle membrane must exhibit a number of physical properties to be applicable in an EUV lithography system. The membrane must be highly transmissive to EUV radiation. The membrane must exhibit desirably low levels of reflectivity and scattering at relevant wavelengths. The membrane must exhibit high mechanical strength and stability. The membrane must perform well in a chemical environment, particularly in the presence of hydrogen. The membrane must additionally be stable at high temperatures that occur during EUV lithography processes, which may be in a range from 600 to 1000 degrees Celsius.

Previous pellicles have been made in the form of very thin continuous film membranes. The thin films have been made of materials that include silicon (polysilicon), silicon nitride, silicon carbide, graphene, and ceramics. These thin continuous films suffer certain deficiencies, such as being difficult to form and maintain as a flat film, i.e., being prone to wrinkles, which detrimentally affect pellicle performance.

As an alternative to continuous thin films, researchers have investigated the use of carbon nanotubes (CNTs) for pellicle membranes. Networks of interconnected CNTs can be formed into thin film-like membranes, which are stable at high temperatures and highly transmissive to EUV radiation. Additionally, the three-dimensional structure of the CNT membrane is significantly more resistant to wrinkling compared to a continuous two-dimensional thin film. The major disadvantage of CNTs, however, is their insufficient resistance to hydrogen. In the reducing atmosphere required in the EUV lithography process, hydrogen radicals attack the CNT membranes causing significant erosion, leading to catastrophic failure of the pellicle.

To prevent the effects of hydrogen radicals, a CNT-membrane pellicle can be coated with a hydrogen-resistant material such as a thin coating of molybdenum or boron. Various methods, such as atomic layer deposition, chemical vapor deposition, physical vapor deposition, etc., can be used to deposit a thin layer of the material onto the nanotubes of the membrane. However, while this coating can improve the membrane's resistance to hydrogen radicals, the significant drawbacks of added weight, potential flaking due to delamination of the coated layer from the carbon nanotubes, and reduced EUV transmission capabilities, prevent this technique from being widely used.

The semiconductor processing industry continues to research new and better materials for pellicle membranes for EUV lithography.

SUMMARY

In one aspect, the description relates to a pellicle that is useful in an extreme ultraviolet lithography process, the pellicle comprising a membrane that includes silicon carbide nanostructures.

In another aspect, the description relates to a lithography mask assembly that is useful in an extreme ultraviolet lithography process. The mask assembly includes: a frame having a perimeter, a first face, a second face, and a thickness between the first face and the second face, a pellicle disposed at the first face, the pellicle comprising a membrane that includes silicon carbide nanostructures, a reflective lithography mask disposed on the second face and having a patterned reflective surface facing the pellicle.

In yet another aspect, the description relates to a method of exposing a photoresist on a substrate to extreme ultraviolet light. The method includes: transmitting extreme ultraviolet light through a pellicle membrane that comprises silicon carbide nanostructures.

DETAILED DESCRIPTION

The present application describes pellicles for use in extreme ultraviolet (EUV) lithography, as well as methods for preparing and using these pellicles.

A pellicle as described includes a membrane that is made from materials that include silicon carbide nanostructures ("SiC nanostructures").

The membrane includes silicon carbide nanostructures, and may typically also include other materials that are present in (e.g., reactants) or that are produced by (side-products) a process that is used to form the silicon carbon nanostructures. These other materials can include reactants or reaction products of a process that forms the silicon carbide nanostructures. The specific materials that will be present will depend on the specific method that is used for forming the silicon carbide nanostructures. Example materials include various types of silicon-based materials, carbon-based materials, and silicon carbide materials such as silicon and various forms of carbon (e.g., graphene, graphite, and carbon nanotubes).

The use of silicon carbide nanostructures in the pellicle membrane provides a membrane that exhibits physical properties that provide effective or advantageous performance during use of the pellicle membrane in extreme ultraviolet lithography. A useful or preferred pellicle can exhibit high mechanical strength and high transmission of (low adsorption of) radiation of wavelengths that are in the extreme ultraviolet range. Other useful physical properties include resistance to high temperature, the ability to maintain a flat non-wrinkled form during preparation and use of the pellicle, and resistance to reactive chemicals (especially resistance to degradation by hydrogen radicals). A pellicle as described, by containing silicon carbide nanostructures, can also be made to be both very thin and lightweight.

The pellicle membrane is a thin sheet (membrane) that contains silicon carbide nanostructures (e.g., silicon carbide nanotubes) dispersed within the membrane, and connected or inter-connected to form a thin but cohesive membrane. Useful and preferred membranes will exhibit strength that is sufficient for use as a pellicle membrane, high transmission to radiation in the extreme ultraviolet range, and other physical properties useful in a pellicle that will function in extreme ultraviolet lithography processes.

Figure 1:
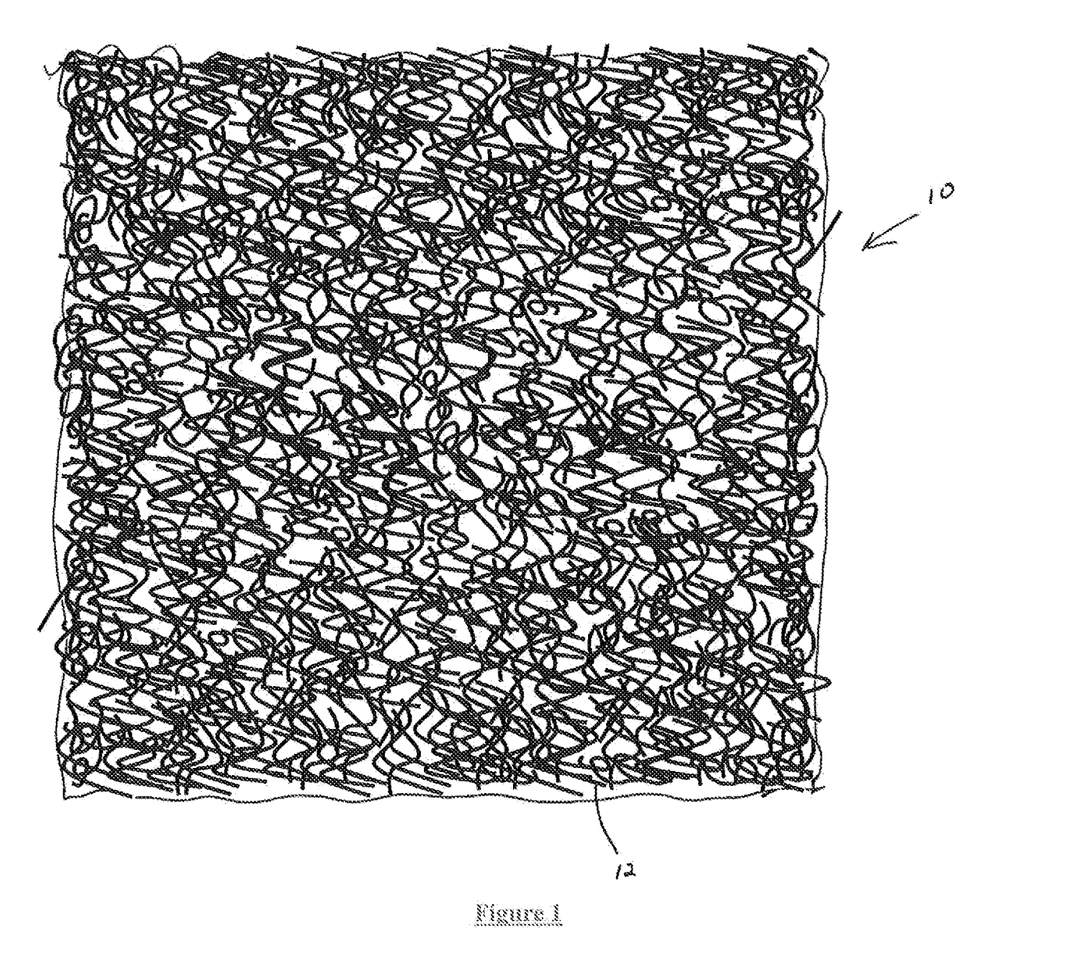
FIG. 1 schematically illustrates a pellicle membrane that contains silicon carbide nanostructures.

Referring to FIG. 1, illustrated is a top, schematic, and microscopic depiction of a portion of a pellicle membrane (10) as described that contains (comprises) silicon carbide nanostructures 12, shown schematically as entangled wavy lines. The example pellicle membrane 10 includes silicon carbide nanostructures 12 (e.g., entangled silicon carbide nanotubes as illustrated) that are arranged in the membrane as a cohesive, interconnected mesh. The membrane is self-supporting, meaning that the membrane is capable of supporting its own weight when being held and suspended by a pellicle frame. The self-supporting membrane is capable of supporting its own weight when having a size (area and thickness) that is useful as a membrane of a pellicle, without the membrane exhibiting undue sagging within a supportive frame.

The area of the membrane may be on a scale of centimeters in each of a length and a width dimension, when suspended by a frame. An example assembly that includes the frame and the membrane may have a square or rectangular perimeter having a length in a range from 1 to 50 centimeters, and a width in a range from 1 to 50 centimeters.

Example thicknesses of a pellicle membrane as described may be in a range of less than 200 nanometers, e.g., less than 100 nanometers, such as in a range from 10, 25, or 50 nanometers up to 100, 150, or 200 nanometers.

The membrane exhibits high transmission of radiation of at least some wavelengths in an extreme ultraviolet range. The membrane may have a transmittance of at least 80, 90, 95, 98, or 99 percent, for at least some wavelengths of light in a range used for EUV lithography, e.g., for at least some wavelengths of light having a wavelength in a range from 1 to 100 nanometers. Useful examples of membranes exhibit transmittance of at least 80, 90, 95, 98, or 99 percent of at least some wavelengths of radiation in a range from 5 to 20 or from 5 to 30 nanometers; e.g., of light having a wavelength of 13.5 nanometers.

A pellicle as described may include a membrane as described that is suspended alone within a pellicle frame, with no additional layers associated with the membrane or the pellicle. Alternately, a pellicle may include a membrane as described, in a frame, that is associated with one or more additional membranes or layers arranged with the membrane in the frame to form the pellicle. The one or more additional membranes or layers of the pellicle may be included as a layer that is effective for any of various purposes, such as to add strength or support to the membrane that contains the silicon carbide nanostructures.

The membrane includes (e.g., comprises, consists essentially of, or consists of) one or more structures of a general type known as silicon carbide nanostructures. Different types of silicon carbide nanostructures are known, many of which are available commercially, or may be prepared by established methods such as by conversion of carbon nanostructures to silicon carbide nanostructures or by deposition techniques. The term "silicon carbide nanostructure" as used herein refers to a structure that contains silicon carbide, and that has at least one dimension that is on a nanometer scale, e.g., at least one dimension that measures 500, 200, 100, or 50 nanometers or less. Example silicon carbide nanostructures have two or three dimensions (length, width, height) that measure 500, 200, 100, or 50 nanometers or less.

Silicon carbide nanostructures include various molecular and structural arrangements of silicon carbide. In some embodiments, a silicon carbide nanostructure can include at least a portion of the structure that is made of silicon carbide (SiC) having an approximately 50:50 atomic ratio of silicon and carbon atoms. A silicon carbide nanostructure includes silicon carbide that may be present in any useful morphology, e.g., arranged in a periodic nanocrystalline form, in an amorphous form, or in a polycrystalline form.

Example silicon carbide nanostructures are referred to as any of: silicon carbide nanotubes ("SiCNTs"), silicon carbide nanowires ("SiCNWs"), silicon carbide nano-whiskers, silicon carbide nanofibers ("SiCNFs"), silicon carbide needles, and silicon carbide nanorods, among other terms. While these terms are regularly used and are generally understood to refer to types of silicon carbide nanostructures, the terms may be given or used to express slightly different meanings to different authors or scientists.

Examples of silicon carbide nanostructures and methods of preparing silicon carbide nanostructures are describe in the following documents: Kholmanov et al., "A Simple Method for the Synthesis of Silicon Carbide Nanorods," J Nanosci Nanotechnol. 2002 October; 2(5):453-6 (describing silicon carbide nanorods); Xie et al., "Synthesis of Silicon Carbide Nanotubes by Chemical Vapor Deposition," J Nanosci Nanotechnol., 2007 February; 7(2):647-52 (describing silicon carbide nanotubes); JP 2011001225A, titled "Method for Producing Single Crystal Silicon Carbide Nanotube," U.S. Pat. No. 7,393,514 to Moy et al., (relating to silicon carbide "nanofibrils"); and "Novel Three-Dimensional Silicon Carbide Nano-Structures," Amelia Heather-Sarah Church Hart, 2016.

Silicon carbide nanostructures as described herein are different from structures that are sometimes referred to as silicon carbide "fibers," which are fibrous structures that are made of silicon carbide and that are produced by forming polymeric fiber precursors and converting the polymeric fiber precursors to silicon carbide fibers using high temperature processing. Silicon carbide fibers are made primarily of silicon carbide molecules, and have the form of elongate fibers that include a diameter often in a range from 5 to 150 microns and a length that is multiple times the diameter of the fiber. While silicon carbide fibers are not excluded from a pellicle or pellicle membrane of the present description, silicon carbide fibers are not considered to be silicon carbide nanostructures.

Examples of silicon carbide nanostructures such as nanotubes, nanowires, nanorods, whiskers, etc., may be formed mostly (e.g., at least 95, 98, or 99 atomic percent) of silicon and carbon. The silicon carbide nanostructures may contain regions or portions that include silicon and carbon present in an approximately 50:50 atomic ratio, i.e., as silicon carbide (SiC). The silicon carbide nanostructure may also include regions that include higher concentrations of atomic carbon (e.g., graphite or graphene), regions of concentrations of silicon (which may be crystalline or amorphous), or minor amounts (less than 5, 2, or 1 atomic percent) of other atoms such as oxygen.

Preferred silicon carbide nanostructures, and preferred pellicle membranes that contain silicon carbide nanostructures, can be made almost entirely of carbon and silicon, e.g., at least 95, 98, 99, or 99.9 atomic percent silicon and carbon, with less than 5, 2, 1, or 0.1 atomic percent of other atomic materials such as oxygen.

Processes that form silicon carbide nanostructures will typically form the desired silicon carbide nanostructures, but will also form other reaction products that may include different forms of silicon carbide nanostructures, or other reaction products that contain silicon, carbon, or both. In a process used to prepare a particular type of silicon carbide nanostructure, such as silicon carbide nanotubes, other types of silicon carbide nanostructures are commonly also present as reaction products. For example, methods of producing silicon carbide nanotubes can often produce silicon carbide nanowires as reaction products. Moreover, reactants that are used in a process of forming silicon carbide nanostructures may not be reacted with perfect efficiency by the process, and non-reacted reactants will also remain in a composition that includes desired silicon carbide nanostructure reaction products.

Silicon carbon nanostructures, therefore, are typically present in a composition that includes a mixture of two or more different types of carbon nanostructures, such as a combination of two or more of silicon carbide nanotubes, silicon carbide nanowires, and silicon carbide nanorods. These silicon carbide nanostructures will typically be present in a composition that also contains other materials that are present as reactants to form the nanostructures, as well as side-products of preparing the nanostructure products. The reactants and side-products may include carbon, nanoscale carbon-based materials (e.g., as atomic carbon, graphite, graphene, carbon nanotubes ("CNTs," etc.)), silicon carbide nanostructures (e.g., nanowires), as well as atomic or nanocrystalline silicon. When a pellicle membrane is formed from a composition that contains two or more different silicon carbide nanostructures, and optional residual reactants and other side-products, the pellicle will also contain a similar mixture of silicon, carbon, and silicon carbide materials.

Some useful methods of forming silicon carbide nanostructures are based on a process of reacting carbon- and silicon-containing reactants at high temperatures. Other methods are based on deposition methods such as chemical vapor deposition. Still other useful methods are based on steps of first forming or providing carbon nano structures (e.g., carbon nanotubes) and then converting the carbon nanostructures (e.g., nanotubes) to silicon carbide nanostructures by heating the carbon nanostructures to an elevated temperature in the presence of silicon. The silicon becomes chemically incorporated into the molecular makeup of the carbon nanostructure and chemically converts at least a portion of the carbon nanostructure into silicon carbide, thereby converting the carbon nanostructure into a silicon carbide nanostructure.

More generally, a process of forming silicon carbide nanotubes by immersion of carbon nanotubes in silicon powder exposes the carbon nanotubes of silicon at conditions that cause atomic silicon to become chemically incorporated into the graphene structure of the carbon nanotubes. The source of the silicon may be solid silicon, such as in the form of a silicon powder, which may be of any useful size range including "small mesh silicon powder," e.g., 60 mesh, 100 mesh, or 325 mesh. See also Hart et al., Velcro-Inspired SiC Fuzzy Fibers for Aerospace Applications, ACS Appl. Mater. Interfaces 2017, 9, 13742-13750; Hart et al., Ultra-low density three-dimensional nano-silicon carbide architecture with high temperature resistance and mechanical strength, Carbon 164 (2020) 143-149.

Methods of forming silicon carbide nanostructures by immersion of carbon nanotubes in small-mesh silicon powder may be advantageous and therefore preferred compared to other methods of forming silicon carbide nanostructures, such as those that involve gaseous silane. Methods that involve gaseous silane can be less preferred due to the toxic nature of gaseous silane, particularly compared to the use of a solid source of silicon, such as non-toxic small-mesh silicon powder, which does not exhibit toxicity.

Forming silicon carbide nanostructures by immersion of carbon nanotubes in silicon powder may also be preferred compared to chemical vapor deposition techniques for forming silicon carbide nanostructures, because chemical vapor deposition techniques include the use of one or more catalysts to "grow" silicon carbide nanomaterials from a starting structure. These processes can be difficult to control, especially with respect to the morphology of the resultant silicon carbide structures. The processes also introduce an undesirable contaminant, the catalyst, to the resulting silicon carbide nanostructure.

Using a method of immersion of carbon nanostructures to form silicon carbide nanostructures. For example, synthesizing silicon carbide nanotubes from carbon nanotubes immersed in silicon, allows the use of a selected and desirable morphological template as a reactant, meaning the carbon nanotubes, which can be selected for features such as: size (length or diameter), number of walls in a nanotube, degree of crystallinity. This ability to select the reactant provides for an ability to maintain control over these physical features of the reactant, and to thereby produce products of the reaction (silicon carbide nanostructures) that exhibit the same desired physical features. Also, the reaction does not require added ingredients such as one or more catalysts, which become contaminants in a silicon carbide reaction product. Still further, an immersion method may allow for a useful degree of control of the amount of silicon that is incorporated into a carbon nanostructure reacting, which allows the resultant nanostructure to be "tuned" or "optimized" for a particular use, such as for a particular application of a pellicle membrane. By controlling and selecting size and morphology features of carbon nanotube reactants, relative amounts (ratios) of reactants (carbon nanotube reactants and silicon), and run temperatures, pressures, and times, the number of carbon nanotube layers converted to silicon carbide can be affected or controlled.

Typically, when forming silicon carbide nanotubes from carbon nanotubes by immersion in silicon, the silicon becomes located first at outer walls (outer rings) of the carbon nanotubes, and the silicon carbide nanotube walls may be considered roughly to form a "core/shell" structure with carbon (graphene rings) as inner walls and silicon carbide as outer walls. By controlling conditions of the conversion process, silicon can be caused to penetrate more deeply into a multi-walled carbon nanotube, producing a higher amount of silicon carbide walls from a carbon nanotube, and converting higher amounts of the carbon walls in the carbon nanotube to silicon carbide.

As a possible mechanism, without placing any limits on the present disclosure, graphene layers (at least a portion of the layers) of carbon nanotubes may be chemically converted to silicon carbide (50:50 Si:C), while the carbon nanotubes substantially retain their original nanotube size (dimensions), wall structure, and morphology. Regardless of any theorized reaction mechanism or molecular structure of a resultant silicon carbide nanotube, according to the present description a silicon carbide reaction product that results from processing carbon nanotubes in a manner that causes silicon atoms to be chemically incorporated into graphene layers of the carbon nanotubes, by high-temperature immersion in silicon, is referred to as a silicon carbide nanotube. While these structures are referred to as "silicon carbide nanotubes," currently-reported silicon carbide nanotubes are not necessarily standard carbon nanotube-like sp2-bonded nanotubes, but may include thick walls of sp3-bonded bulk silicon carbide-like crystal structures. Some are composed of polycrystalline silicon carbide particles, though some are rolled-up nanostructures of silicon carbide. See Hart at 47, citing Fan, J., et al., Silicon Carbide Nanostructures, 2014.

Also, during the conversion of carbon nanotubes to silicon carbide nanotubes, side reactions can occur that produce silicon carbide "nanowires" or other silicon carbide nanostructures, in addition to silicon carbide nanotubes. While a principal intent of this type of immersion process is to convert carbon nanotubes into silicon carbide nanotubes and produce a useful amount of silicon carbide nanotubes, the Applicant has recognized that carbon nanotube reactants do not need to be fully converted into silicon carbide nanotubes, that silicon carbide "nanowires" may be produced as well, that a portion carbon nanotube reactants may remain partially or completely un-converted; a pellicle made to include silicon carbide nanotubes may be useful even if the pellicle also contains an amount of silicon carbide nanowires, an amount of partially or completely un-converted carbon nanotubes, or both silicon carbide nanowires and un-converted carbon nanotubes.

Silicon carbide "nanowires" are three-dimensional elongate structures that are formed from a relatively large number of flat layers or "plates" of silicon carbide, each plate having an area (length and width) on a nanoscale range. The nanowires are formed of these nano-scale layers stacked in a surface-to-surface configuration to form a length of "wire" from the stacked flat layers. The length of each nanowire is equal to the combined thicknesses of the stacked flat layers. A typical major dimension (length) of a nanowire may be substantially greater than the width dimensions of the individual stacked plates. A minor dimension of the nanowire (e.g., referred to as the width or thickness of the nanowire) can typically be significantly greater than a diameter of a carbon nanotube or a silicon carbide nanotube.

In addition to forming nanowires, a step of converting carbon nanotubes to silicon carbide nanotubes is not perfectly efficient, and less than a total amount of carbon nanotube reactant that is subject to a conversion process will be converted completely to silicon carbide nanotubes. Some carbon nanotube reactants may be only partially converted to silicon carbide. For example, outer wall layers of a carbon nanotube may exhibit a higher rate of conversion to silicon carbide compared to a lower rate of conversion at inner wall layers of the carbon nanotube. Also, some amount of carbon nanotubes may not be converted at all to silicon carbide and will remain in an original form of carbon nanotube reactants. The relative amount of carbon nanotubes that are converted to silicon carbide nanotubes may be detected using analytical techniques, for example tunneling electron microscopy (TEM).

According to certain presently useful examples, silicon carbide nanotubes that are included in a pellicle as described may be derived from carbon nanotubes ("CNTs") by an immersion process that exposing ("immerses") the carbon nanotubes to silicon at an elevated temperature that is sufficiently high to cause the silicon to become chemically incorporated into the carbon-carbon bonded molecular structure of the carbon nanotubes, i.e., to chemically convert the graphene structure of the carbon nanotubes into silicon carbide by injecting silicon atoms into the molecular graphene. Example immersion processes expose the carbon nanotubes to silicon that is generated from a solid silicon source by exposing the solid silicon source to elevated temperature under a reducing atmosphere such as gaseous nitrogen, argon, or hydrogen. Useful temperatures may be in a range from 1200 to 1600 degrees Celsius.

Carbon nanotubes (CNTs) are allotropes of carbon that exhibit a cylindrical nanostructure that may be considered to include one or multiple concentric, rolled tubes of a single or multiple layers of graphene. Carbon nanotubes are members of the fullerene structural family and have a long, hollow structure with walls formed by one or multiple, one-atom-thick sheets of connected carbon atoms in the form of graphene. The hollow structure may be formed to place each carbon atom at a specific distance or angle compared to an adjacent carbon atom, in a direction of a length of the hollow structure, and with a specific number of carbon atoms defining a diameter of the hollow structure. The chemical bonding of carbon atoms of nanotubes involves entirely $sp^2$-hybrid carbon atoms.

Carbon nanotubes can be categorized as single-walled carbon nanotubes (SWNTs), double-walled carbon nanotubes (DWNTs), and multi-walled carbon nanotubes (MWNTs). A single-walled carbon nanotube includes only one single graphene cylinder, whereas a double-walled or a multi-walled carbon nanotube includes two walls or multiple (e.g., several) concentric graphene cylinders. For a multi-walled carbon nanotube structure, the number of concentric walls may vary from 3 to 25 or more. A diameter of a single-walled nanotube may be in a range from 0.7 to 3 nanometers. A diameter of a multi-walled nanotube structure may be larger, e.g., from about 5 to about 50 nanometers. Hart identifies three different chiralities of carbon nanotubes: the "armchair tube," the "zigzag tube," and the "chiral tube." See Hart at 23.

According to the present description, a pellicle includes a membrane that is made to include (comprise, consist of, or consist essentially of) silicon carbide nanostructures, such as (but not necessarily) silicon carbide nanotubes.

A membrane that contains silicon carbide nanostructures may be made by various methods of forming a membrane that contains nanostructures. By example methods, a membrane may be formed that contains carbon nanostructures, such as carbon nanotubes, and the carbon nanostructures may be converted to silicon carbide nanostructures by exposing the membrane and the carbon nanostructure components of the membrane to silicon at an elevated temperature to convert the carbon nanostructure components into silicon carbide nanostructures.

By other example methods, silicon carbide nanostructures (e.g., silicon carbide nanotubes) may be synthesized in one step, and the silicon carbide nanostructures may be formed into a membrane that contains the silicon carbide nanostructures in a subsequent step. Typically, the silicon carbide nanostructures are part of a composition that contains the silicon carbide nanostructures along with other materials that were used as reactants to prepare the silicon carbide nanostructures, or with other materials that are produced during a process of forming the silicon carbide nanostructures from the reactants. The membrane made with these silicon carbide nanostructures will typically contain the silicon carbide nanostructures as well as the residual reactants and side reaction products.

Silicon carbide nanostructures formed by converting carbon nanostructures to silicon carbide nanostructures by exposing the carbon nanostructures to silicon will have size features and dimensions that are the same as or similar to the size features and dimensions of the carbon nanostructures before the conversion to silicon carbide.

While the following example refers to a membrane that is formed to include nanostructures that includes silicon carbide nanotubes, the present description contemplates membranes for use in pellicles as described, with the membrane containing other types of silicon carbide nanostructures that are different from silicon carbide nanotubes.

Within the present description, a "pellicle membrane" (or just "membrane" for short) refers to a very thin film that includes an arrangement of a very large number of interconnected nanostructures that together are maintained in a connected, self-supporting structure such as a substantially two-dimensional (on a macro-level) mesh, web, non-woven material, grid, or similar structure made up of individual nanostructures or bundles or collections of nanostructures, with the nanostructures together forming a very thin (referred to as two-dimensional) membrane having a thickness that is on a nanometer scale.

In example membranes formed from carbon nanotubes or silicon carbide nanotubes (i.e., nanotube membranes), groups of individual nanotubes may be aligned to form bundles. Segments of nanotube bundles may be randomly arranged within a nanotube membrane, or may be arranged or aligned along a predominant or major direction or along a plurality of major directions.

A pellicle that is prepared to include silicon carbide nanotubes may be prepared by methods or steps that are known or useful for forming a film, membrane, or pellicle from a material that includes nanostructures. Various methods are known to be useful to form pellicles or membranes from carbon nanotubes and coated carbon nanotubes. Techniques that will be useful forming a pellicle, film, or membrane that includes silicon carbide nanostructures, include techniques that are presently known and useful for forming a film, membrane, or pellicle that includes carbon nanotubes but does not contain silicon carbide nanotubes. See, for example, U.S. Pat. No. 10,712,659, the entirety of which is incorporated herein by reference.

By one example method, a pellicle membrane of the present description can be prepared by first forming a pellicle membrane that includes carbon nanotubes (uncoated carbon nanotubes) by any effective method, and then converting at least a portion of the carbon nanotubes that are part of the pellicle membrane to silicon carbide.

By other techniques, silicon carbide nanotubes can be prepared (or otherwise provided) first, and then in a subsequent step the silicon carbide nanotubes are formed into a thin pellicle membrane. The silicon carbide nanotubes may be a component of a composition that contains the silicon carbide nanotubes in combination with other carbon-containing, silicon containing, and silicon carbide materials, such as reactants and by-products of the reaction used to prepare the silicon carbide nanotubes. Techniques that are useful to form a membrane from the silicon carbide nanotubes, or a composition (a "silicon carbide nanotube composition") that contains the silicon carbide nanotubes, may include dispersing the "silicon carbide nanotube composition" with a dispersant, with ultrasonic agitation. The dispersed silicon carbide nanotube composition can then be formed into a very thin layer on a surface, such as by spraying or otherwise coating the silicon carbide nanotube composition onto the surface as a very thin layer.

Figure 2:
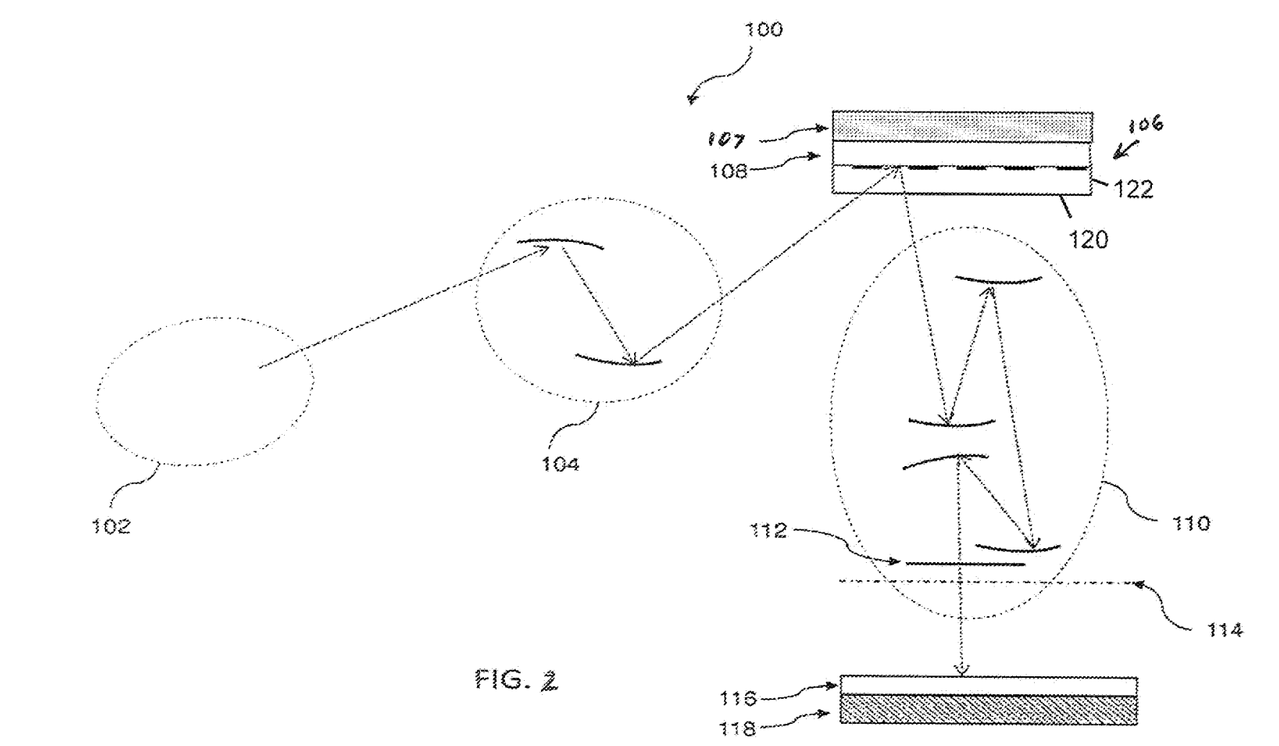
FIG. 2 shows an example of a lithography system that includes a pellicle as described.

Illustrated at FIG. 2 is a schematic view of lithography system 100, which can include a pellicle or pellicle membrane as described. Lithography system 100 shows example components of an extreme ultraviolet (EUV) lithography system with which a pellicle as described may be used in a lithography process that chemically affects a resist layer ("photoresist") by exposing a portion of the resist layer to EUV light, e.g., light having a wavelength of 13.5 nanometers or another effective EUV wavelength. The resist layer is chemically sensitive to the EUV light (e.g., is an "EUV resist") and is chemically altered by the light.

Example EUV lithography system 100 includes subsystems that include radiation source 102, illuminator 104, mask assembly 106 that includes mask 108 and pellicle 120 and frame 122, projection optics 110, and substrate assembly 118 configured to receive semiconductor substrate 116. During use, EUV light from radiation source 102 is directed toward illuminator 104 (which includes a set of reflective mirrors) and projected through pellicle 120 held by frame 122 and onto reflective mask 108. A reflected mask image is directed back through pellicle 120 and toward projection optics 110, which focuses the EUV light and projects the EUV light onto semiconductor substrate 116 to expose a portion of an EUV resist layer deposited at the surface of substrate 116. The EUV radiation is strongly absorbed by most materials used in lithography equipment; therefore, transmission optics are not present with EUV lithography equipment generally, or as illustrated at system 100 of FIG. 2. All optics in EUV lithography systems such as system 100 are of the reflective type.

Each subsystem of lithography system 100 may be housed in, and thus operate within, a high-vacuum environment, for example, to reduce atmospheric absorption of EUV light.

According to example system 100, radiation source 102 generates EUV light, i.e., is a EUV radiation source. The EUV light may have a wavelength in a range from about 1 nm to about 100 nanometers, e.g., light in a range from 5 to 25 nanometers, such as light centered a wavelength of 13.5 nm. Radiation source 102 may include a plasma source, such as a discharge-produced-plasma (DPP) or a laser-produced-plasma (LPP). In some examples, radiation source 102 also includes a collector, which may be used to collect EUV light generated from the plasma source and to direct the EUV light toward imaging optics such as the illuminator 104.

Light from radiation source 102 is directed toward illuminator 104, which may include only reflective optics (and no transmissive optics), such as a single mirror or a mirror system having multiple mirrors that direct light from radiation source 102 to mask assembly 106, and particularly to a reflective surface of mask 108 of mask assembly 106.

Mask assembly 106 is adapted to secure mask 108 and pellicle 120 in place during operation of system 100. Mask assembly 106 includes mask 108, pellicle 120, and frame 122 to support mask 108 and pellicle 120 during use. In some example mask assemblies, the frame to support the pellicle may be the same as the frame to support the mask. In other mask assemblies, the frame to support the mask may be separate from the frame to support the pellicle, but the two frames can be combined to form a frame assembly that supports both the mask and the pellicle.

Because example system 100 may be housed in, and thus operate within, a high-vacuum environment, mask assembly 106 may be supported by an electrostatic chuck (e-chuck) (107). Mask assembly 106 includes reflective lithography mask 108, frame 122, and pellicle 120. Pellicle 120 includes a planar membrane that is spaced over a surface of mask 108 an even distance away from a reflective surface of mask 108. Pellicle 120 and mask 108 are held at a small distance apart in a parallel configuration, with frame assembly 122 supporting both mask 108 and pellicle 120 at a perimeter of each of mask 108 and pellicle 120.

As with other optical components of EUV lithography system 100, mask 108 is also reflective and not transmissive. As illustrated, light passes from illuminator 104, through pellicle 120, and impinges on reflective surfaces of mask 108. The light is reflected from the reflective surface of mask 108 and is directed back through pellicle 120 toward projection optics 110, which collect the patterned EUV light reflected from mask 108. The EUV light that is collected by projection optics 110 (reflected from mask 108) carries an image of the pattern defined by mask 108. Projection optics 110 provide for imaging the pattern of mask 108 onto semiconductor substrate 116 located at substrate assembly 118. Projection optics 110 focus the collected EUV light and project the EUV light onto a surface of semiconductor substrate 116 to expose an EUV resist layer deposited at the surface of semiconductor substrate 116.

Substrate assembly 118 secures and positions semiconductor substrate 116 to be patterned. Semiconductor substrate 116 may be a semiconductor wafer, such as a silicon wafer, germanium wafer, silicon-germanium wafer, III-V wafer, or other type of wafer. Semiconductor substrate 116 may be coated with a resist layer (e.g., an EUV resist layer) that is sensitive to EUV light. EUV resists may have stringent performance standards. For purposes of illustration, an EUV resist may be designed to provide at least 22 nm resolution, at least approximately 2 nm line-width roughness (LWR), and sensitivity of at least 15 mJ/cm$^2$.

The various subsystems of lithography system 100, including those described above, are integrated and are operable to perform an EUV lithography exposing process. Optionally, while not illustrated, lithography system 100 may also include other modules or subsystems that may be integrated with (or be coupled to) one or more of the subsystems or components described herein.

Figure 3:
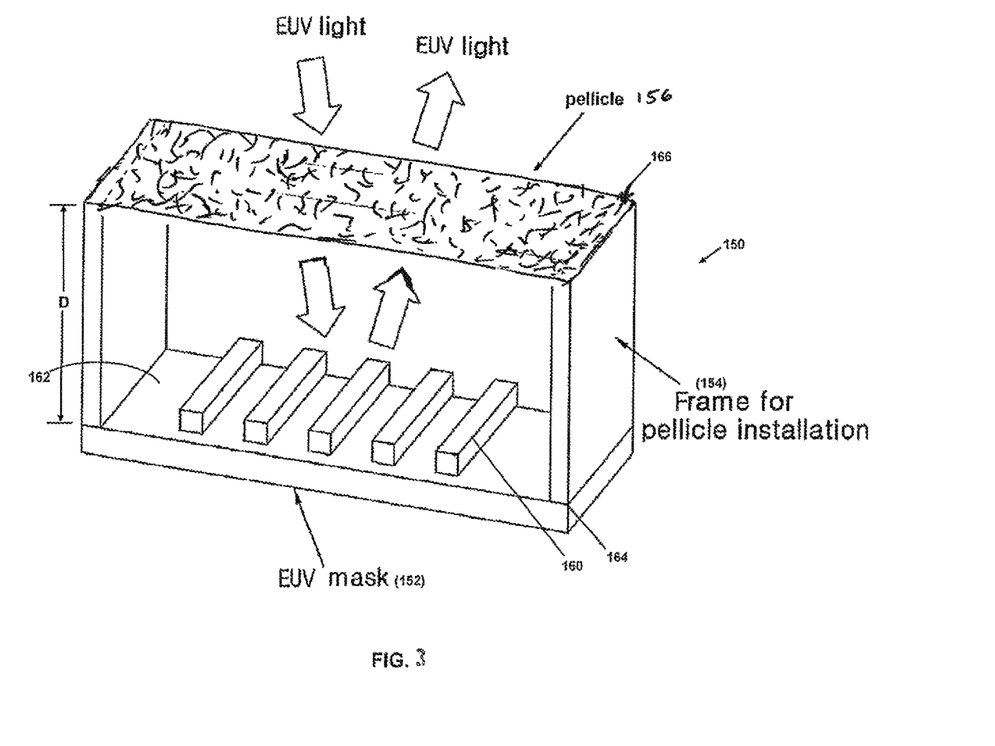
FIG. 3 shows a mask assembly that includes a mask and a pellicle for EUV lithography.

Referring to FIG. 3, illustrated is an example of a lithography mask assembly 150 that includes reflective mask 152, frame 154, and pellicle 156. Mask 152 includes reflective surfaces 162, and non-reflective pattern 160. Mask 152 is held in a suspended, planar configuration about a perimeter of mask 152 by frame or frame assembly 154. In specific, frame or frame assembly 154 extends about a perimeter that has a length and a width, and defines two surfaces, 164, 166, e.g., a top and a bottom surface (or a front and a rear surface). One surface, bottom surface 164 as illustrated, supports mask 152 at a perimeter of mask 152 and holds mask 152 in a planar, suspended configuration with reflective mask surface 162 facing pellicle 156. The second surface, top surface 166 as illustrated, supports pellicle 156 at a perimeter of pellicle 156 and holds pellicle 156 in a planar, suspended configuration with a uniform distance (d) between pellicle 156 and the upper surface of mask 152 over the entire areas of the pellicle and the mask. Overall, frame or frame assembly 154 supports pellicle 156 and mask 152 in a parallel configuration with an even spacing (having a dimension (d)) between opposed surfaces of mask 152 and pellicle 156. As illustrated frame 154 is a single piece frame, but the frame may alternately be a multi-piece frame assembly that includes multiple frames that fit together as a single frame assembly, for example with one frame of a frame assembly supporting pellicle 156 and a second frame of the frame assembly supporting mask 152.

The invention claimed is:

1. A pellicle useful in an extreme ultraviolet lithography process, the pellicle comprising a membrane that includes silicon carbide nanostructures, wherein the membrane is capable of being self-supporting such that it supports its own weight when being held and suspended by a pellicle frame, and wherein the silicon carbide nanostructures are silicon carbide nanotubes having a core/shell structure comprising silicon carbide outer walls and graphene inner walls resulting from the chemical conversion of carbon nanotubes.

2. The pellicle of claim 1, the silicon carbide nanostructures comprising silicon carbide nanotubes.

3. The pellicle of claim 1, having a transmittance of at least 80 percent of light having a wavelength of 13.5 nanometer.

4. The pellicle of claim 1, the membrane having a thickness that is less than 200 nanometers.

5. The pellicle of claim 1, the membrane having a thickness in a range from 50 to 150 nanometers.

6. The pellicle of claim 1 supported in a planar configuration by a frame at a perimeter of the pellicle.

7. The pellicle of claim 1, consisting of the membrane.

8. The pellicle of claim 1, that does not include a metal coating.

9. A lithography mask assembly useful in an extreme ultraviolet lithography process, the mask assembly comprising:
a frame having a perimeter, a first face, a second face, and a thickness between the first face and the second face;
a pellicle disposed at the first face, the pellicle comprising a membrane that includes silicon carbide nanostructures, wherein the membrane is capable of being self-supporting such that it supports its own weight when being held and suspended by a pellicle frame, and wherein the silicon carbide nanostructures are silicon carbide nanotubes having a core/shell structure comprising silicon carbide outer walls and graphene inner walls resulting from the chemical conversion of carbon nanotubes; and
a reflective lithography mask disposed on the second face and having a patterned reflective surface facing the pellicle.

10. The mask assembly of claim 9, the silicon carbide nanostructures comprising silicon carbide nanotubes.

11. The mask assembly of claim 9, having a transmittance of at least 80 percent of 13.5 nanometer light.

12. The mask assembly of claim 9, the membrane having a thickness in a range from 50 to 150 nanometers.

13. The mask assembly of claim 9, wherein the pellicle consists of the membrane.

14. The mask assembly of claim 9, wherein the pellicle does not include a metal coating.

* * * * *